(12) United States Patent
Wu (10) Patent No.: US 7,850,009 B2
(45) Date of Patent: Dec. 14, 2010

(54) CLEAN CONTAINER HAVING ELASTIC POSITIONING STRUCTURE

(75) Inventor: Tzong-Ming Wu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 482 days.

(21) Appl. No.: 12/005,401

(22) Filed: Dec. 27, 2007

(65) Prior Publication Data

US 2008/0160235 A1    Jul. 3, 2008

(30) Foreign Application Priority Data

Dec. 29, 2006  (TW) ............................... 95150075 A (51) Int. Cl.
*B65D 85/90* (2006.01)

(52) U.S. Cl. ...................... 206/710; 206/454

(58) Field of Classification Search ................ 206/454, 206/455, 710–712, 586, 591–594; 355/72, 355/75
See application file for complete search history.

(56) References Cited

U.S. PATENT DOCUMENTS

| | | | | |
|---|---|---|---|---|
| 3,615,006 A | * | 10/1971 | Freed ........................ | 206/454 |
| 4,776,462 A | * | 10/1988 | Kosugi et al. ............... | 206/454 |
| 4,842,136 A | * | 6/1989 | Nakazato et al. ............ | 206/454 |
| 6,216,873 B1 | * | 4/2001 | Fosnight et al. ............. | 206/710 |
| 7,017,750 B2 | | 3/2006 | Matsutori et al. | |
| 7,077,270 B2 | | 7/2006 | Matsutori | |
| 7,581,372 B2 | * | 9/2009 | Durben et al. ............... | 53/471 |
| 2004/0004704 A1 | * | 1/2004 | Wiseman et al. ............. | 355/75 |
| 2005/0056441 A1 | * | 3/2005 | Rider et al. ................ | 174/35 R |

FOREIGN PATENT DOCUMENTS

| | | |
|---|---|---|
| JP | 03-211857 | 9/1991 |
| JP | 10-189704 | 7/1998 |
| TW | 593077 | 6/2004 |
| TW | 200604069 | 2/2006 |

\* cited by examiner

*Primary Examiner*—Luan K Bui
(74) *Attorney, Agent, or Firm*—Rabin & Berdo, P.C.

(57) ABSTRACT

A clean container having an elastic positioning structure includes a support element and a back positioning element on a base. A cover is disposed for covering the base, and a positioning part is disposed between the cover and the base, which has two elastic arms extended laterally, and each elastic arm extends with a pushing surface respectively. When a plate of brittle material is placed on the base, and the cover is closed, the pushing surfaces are elastically pressed against and push the plate respectively, so that the plate moves backwards and presses against the back positioning element. Therefore, the plate is prevented from being damaged. Additionally, the base, the cover, and the positioning part are made of a conductive material, so that the electrostatic charges for the plate is conducted out of the clean container, and has a protective function of an electrostatic discharge.

20 Claims, 11 Drawing Sheets

CLEAN CONTAINER HAVING ELASTIC POSITIONING STRUCTURE

CROSS-REFERENCE TO RELATED APPLICATIONS

This non-provisional application claims priority under 35 U.S.C. §119(a) on Patent Application No(s). 095150075 filed in Taiwan, R.O.C. on Dec. 29, 2006, the entire contents of which are hereby incorporated by reference.

BACKGROUND OF THE INVENTION

1. Field of Invention

The present invention relates to a positioning structure of a clean container. More particularly, the present invention relates to a positioning structure, applicable in a clean container for elastically pushing against and positioning a plate made of a brittle material.

2. Related Art

For a common clean container, regardless of a mask box, a reticle box, a wafer box, or a glass substrate box, a mask, a wafer, a reticle, or a glass substrate is usually accommodated therein. However, the mask, the reticle, the wafer, or the glass substrate has an extremely high requirement on the ultra-clean storage environment. For example, the current semiconductor fabricating process requires the environmental quality to reach a level above Class 1, so that the contamination caused by fine particles and the effect of the electrostatic charges or the electrostatic field must be strictly prevented. Therefore, in a semiconductor or flat-panel display manufacturing process, a mask, a reticle, a wafer, or a glass substrate should be performed in an ultra-clean environment without particles. The clean container plays an important role as an environment meeting the clean requirements in the process for fabricating semiconductors or flat panel displays, so as to ensure the mask, reticle, wafer, or glass substrate to be kept in an environment meeting the clean requirements when being transported, detached, and stored.

Figure 1A:
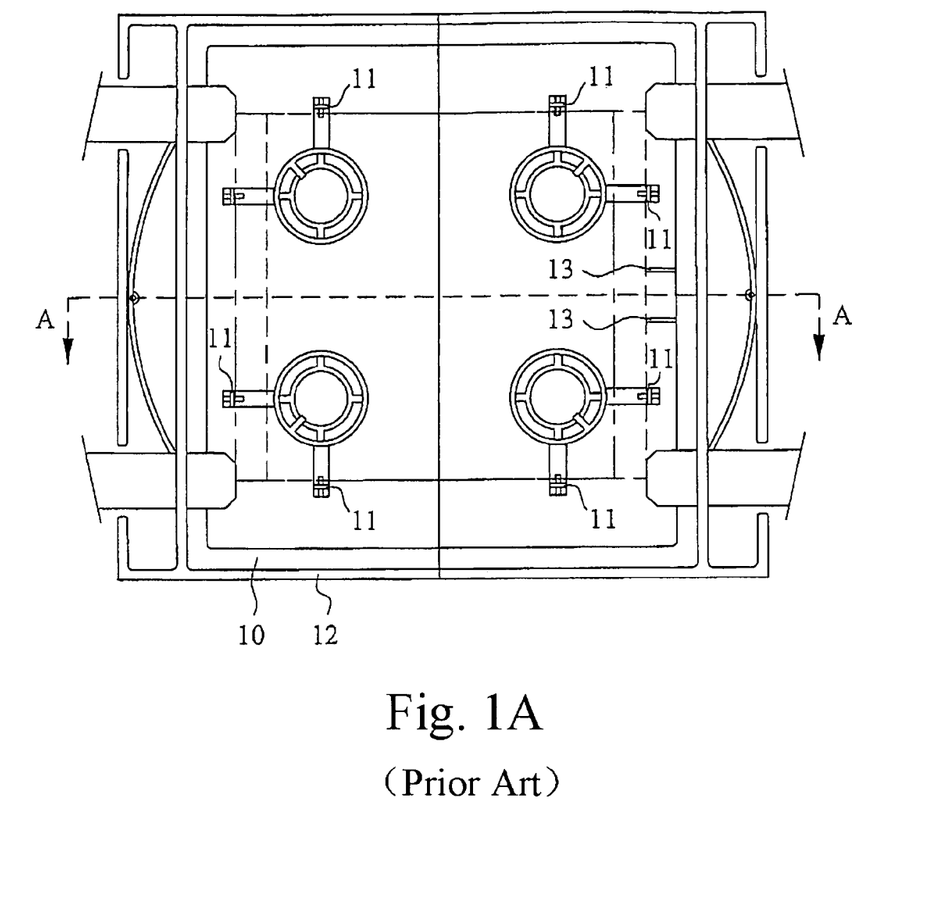
FIG. 1A is a sectional top view of a reticle box in the prior art.
Figure 1B:
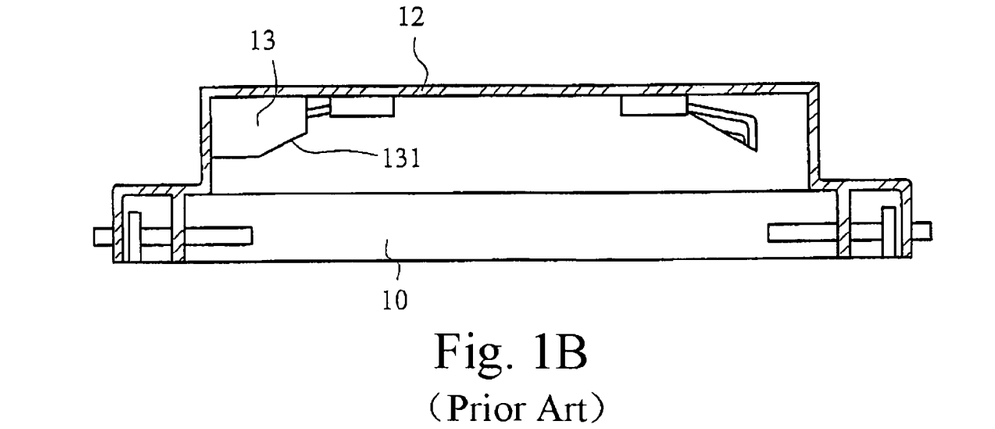
FIG. 1B is a schematic sectional diagram of FIG. 1 obtained along the line A-A.
Figure 2A:
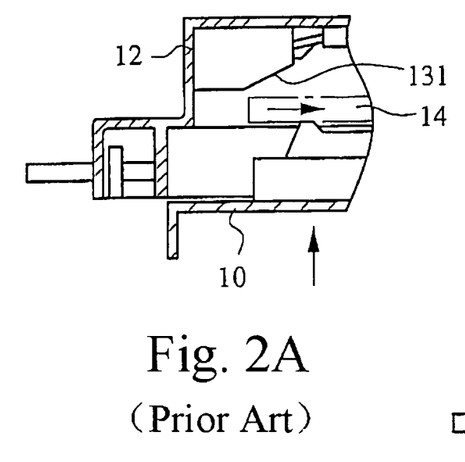
FIGS. 2A to 2D are schematic diagrams of the motion of rigidly pushing against the reticle box in the prior art.
Figure 2B:
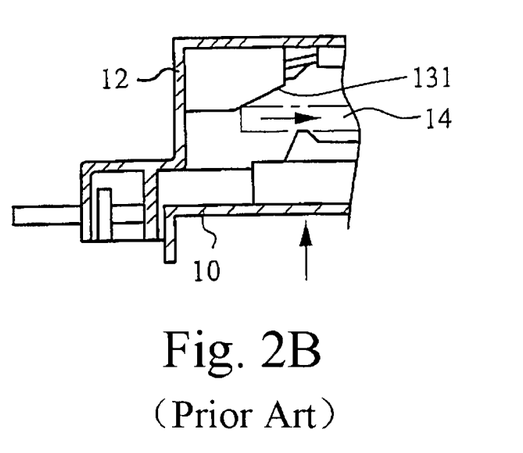
Figure 2C:
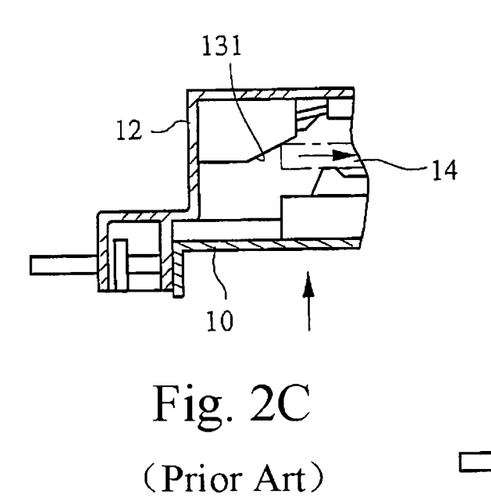
Figure 2D:
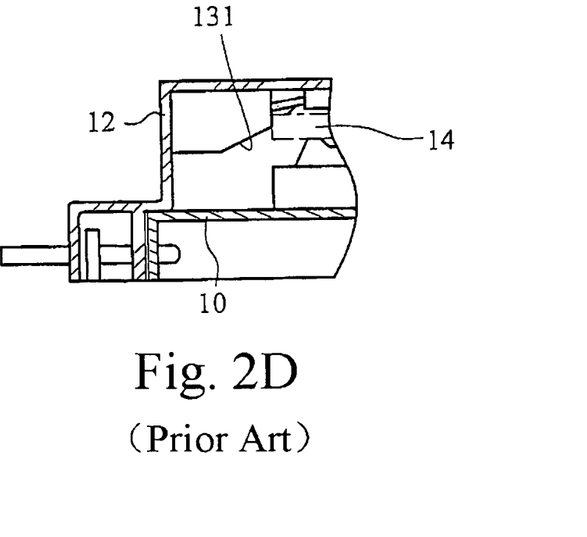

As disclosed in U.S. Patent Publication No. 2004/0004704, referring to FIGS. 1A, 1B, 2A to 2D, FIG. 1A is a sectional top view of a mask box in the prior art; FIG. 1B is a schematic sectional diagram of FIG. 1 obtained along the line A-A; and FIGS. 2A to 2D are schematic diagrams of the motion of rigidly pushing against the mask box in the prior art. Taking the reticle box as an example, the reticle accommodated therein must be positioned on the base of the reticle box, so as to avoid the friction caused by the movement of the reticle in the reticle box when the reticle is transported, detached, and stored. According to a conventional method, the base 10 of the reticle box has a baffle 11 disposed on the upper surface for positioning the reticle 14, and has a guide rib 13 formed on the upper cover 12 of the reticle box, and an inclined plane 131 formed on the guide rib 13. Afterwards, the reticle 14 in the reticle box is pushed by utilizing the inclined plane 131, such that the reticle presses against the baffle 11, thereby positioning the reticle 14. However, the inclined plane 131 in the prior art is not designed with an elastic property, and it will directly press against the reticle 14, so when the reticle 14 in the reticle box is pushed by the inclined plane 131, it is extremely likely to generate fine particles and electrostatic charges due to direct and rigid crashing, contacting, and friction, thereby causing a contamination to the reticle 14.

Furthermore, the above conventional inclined plane is not designed with an electrical conductive property, so that the electrostatic charges of the reticle cannot be conducted out of the reticle box.

SUMMARY OF THE INVENTION

In view of the defects of techniques in the prior art, the present invention is directed to a positioning structure screwed on a cover for elastically pushing and positioning a plate of brittle material, and conducting the electrostatic charges of the plate of brittle material out of a cleaning container. The present invention is also directed to a clean container engaged on the inner surface of a cover for elastically pushing and locating a plate of brittle material, and for conducting the electrostatic charges of the plate of brittle material out of the container, so as to solve the technical problems in providing a clean container disposed on the inner surface of a cover to elastically push and position a plate of brittle material. The present invention provides a clean container having an elastic positioning structure, which comprises: a base, a cover, and a positioning part. The base has an upper surface, a plurality of support elements, a plurality of lateral positioning elements, and a plurality of back positioning elements. The cover is used for covering the base firmly, and has a top plate with an upper surface and a lower surface. The positioning part is disposed on the lower surface, and has a body, and a front end of the body respectively has a first elastic arm and a second elastic arm extended laterally, and the end surfaces of the first elastic arm and the second elastic arm form a pushing surface respectively.

In the clean container, the top plate further has at least one through-hole penetrating through the upper surface and the lower surface. The top surface of the body has at least a stud corresponding to the nut hole, and the upper surface further has a mounting plate screwed thereon, and the mounting plate is connected to the stud of the positioning part by means of passing a bolt through the through-hole of the top plate.

In the clean container, the lower surface of the top plate has a first engaging element, and the top surface of the boy of the positioning part has a second engaging element corresponding to the first engaging element. The first engaging element and the second engaging element form an engaging structure to embed and dispose the positioning part in the lower surface of the cover. The first engaging element is at least one groove, and the second engaging element is a post corresponding to the groove; or reversely, the first engaging element is at least a post, and the second engaging element is a groove corresponding to the post.

The end surfaces of the first elastic arm and the second elastic arm also can form a positioning surface respectively. The back end of the positioning part also can respectively have a third elastic arm and a fourth elastic arm extended laterally, and the third elastic arm and the fourth elastic arm respectively have a flange disposed on the bottom thereof, and have a positioning slant disposed on the external side of the end surfaces. Additionally, the positioning part also can form a snapping arm on the back end, and the snapping arm has a pair of downward grooves, corresponding to the back positioning element, so as to provide the positioning part with a function of conducting the electrostatic charges through the base to the ground when the cover and the base are closed, and a function of fixing the positioning part.

The clean container having a positioning structure according to the embodiment of the present invention has the following effects: elastically pushing and positioning the plate of brittle material with the pushing surface and the positioning surface on the plurality of elastic arms for the positioning part according to the present invention, and meanwhile, adjusting the angle thereof, so as to solve the problem in the prior art that the reticle is easily contaminated by the particles generated by directly contacting, abrading, and pushing the plate of brittle material. Furthermore, besides pushing the plate of brittle material for being positioned, the positioning part according to the present invention can further form a continuous, stable, and elastic pressure on the plate of brittle material, so as to generate a preferred fastening effect on the plate of brittle material upon moving the clean container. Additionally, all the positioning part, the cover, and the base of the clean container according to the present invention are made of a conductive material, so that the electrostatic charges of the plate of brittle material can be conducted out of the clean container, thus preventing the plate of brittle material from being damaged by the electrostatic discharging occurred when the electrostatic charges are accumulated on the plate of brittle material.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 3:
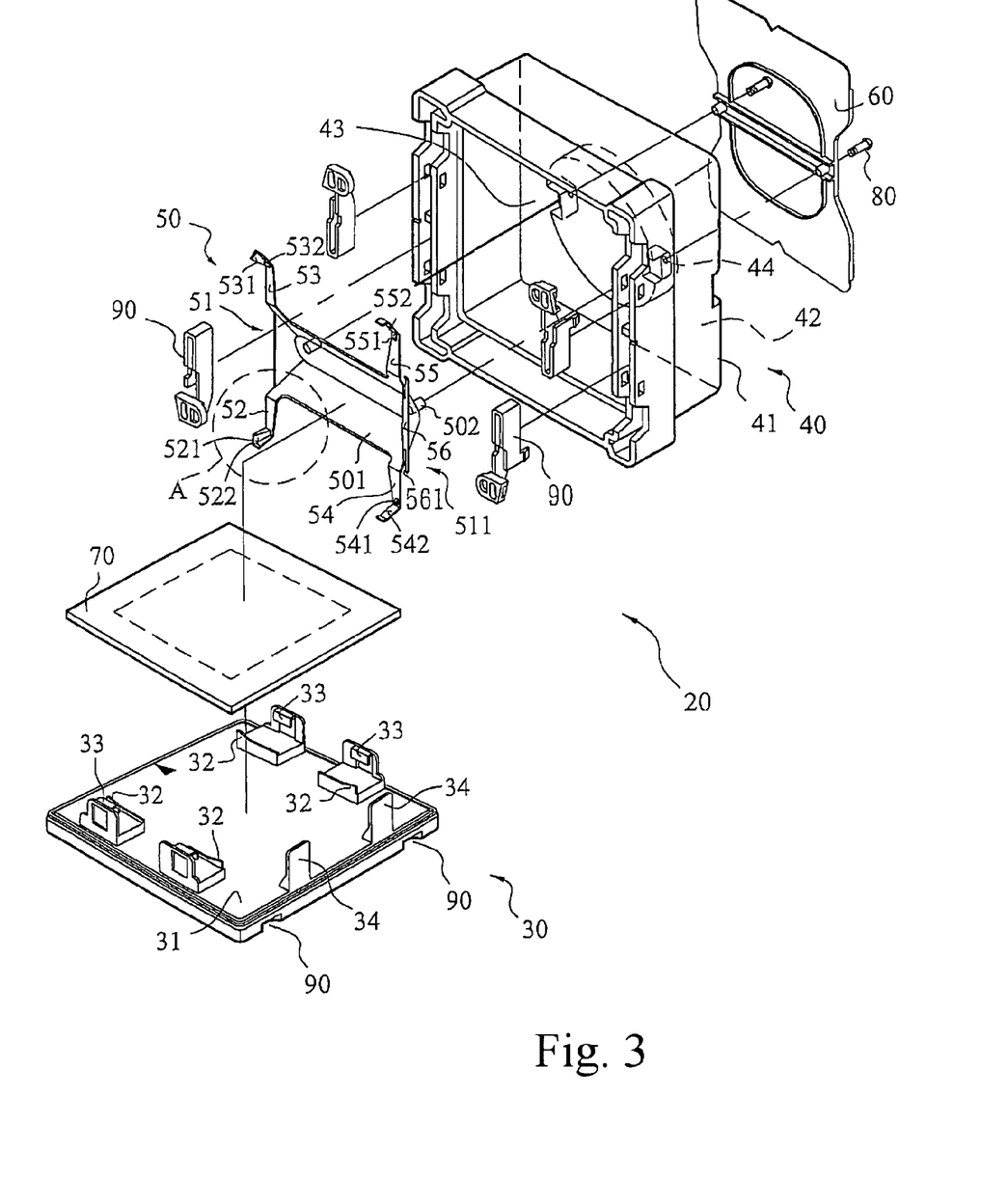
FIG. 3 is an exploded stereogram of a clean container having an elastic positioning structure according to an embodiment of the present invention.
Figure 4:
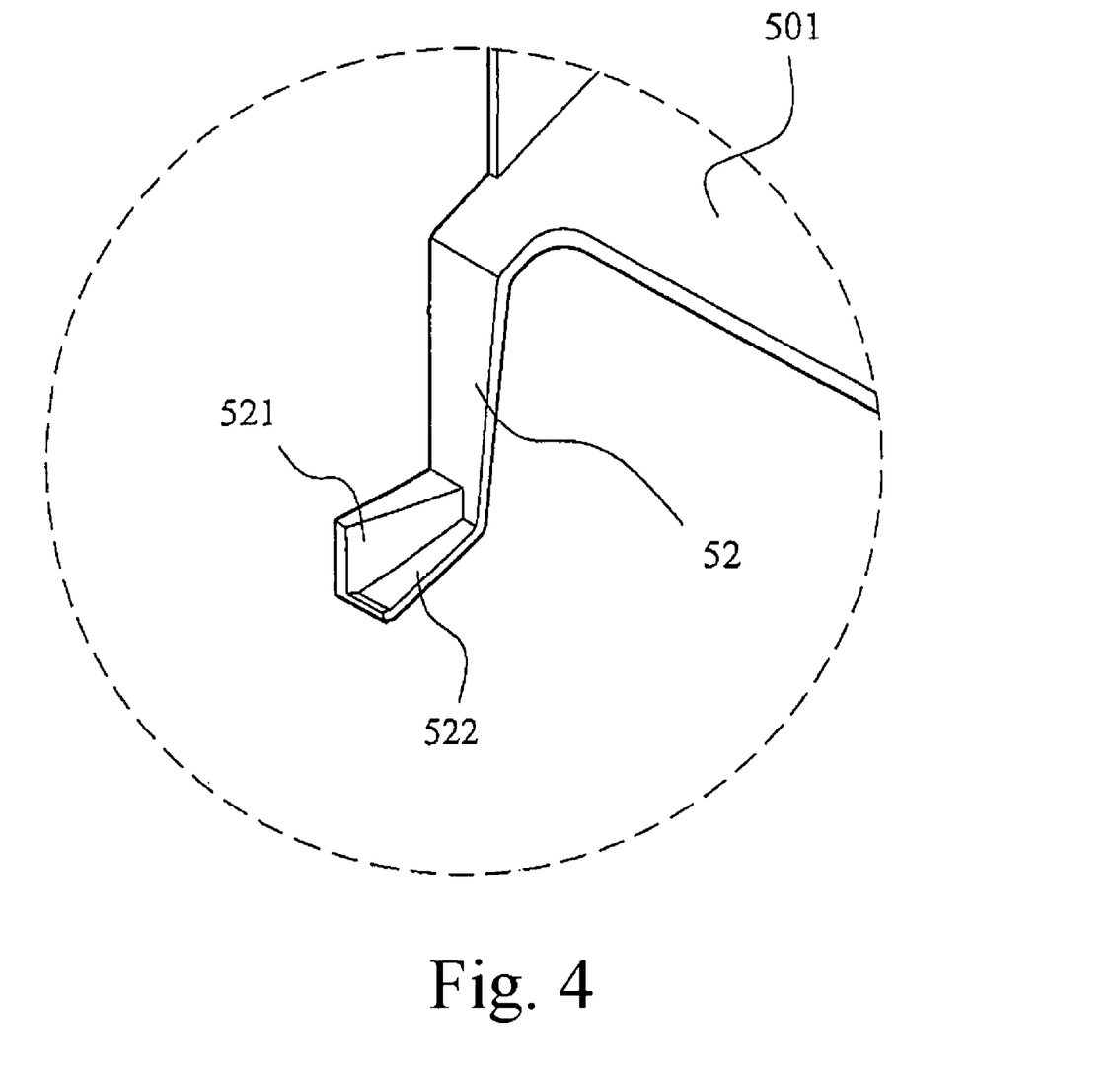
FIG. 4 is a schematic partially enlarged diagram of Part A in FIG. 3.
Figure 5:
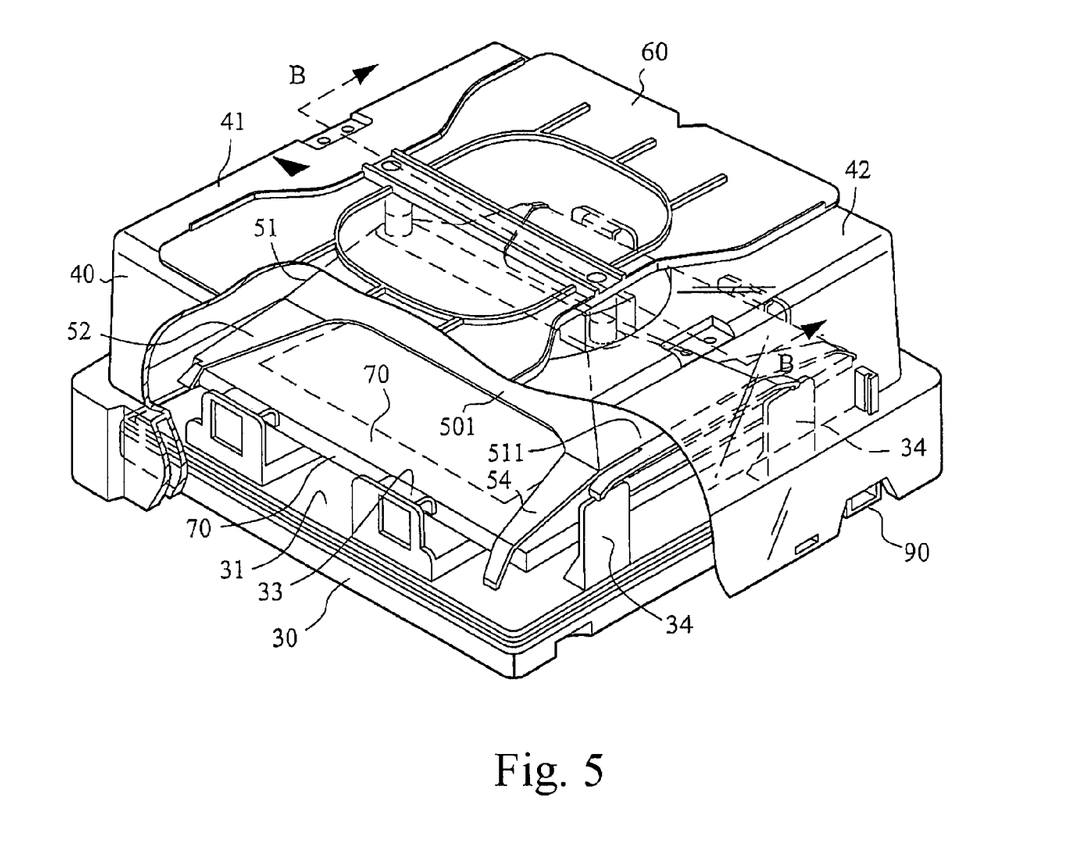
FIG. 5 is a schematic combination stereogram of the clean container having an elastic positioning structure according to an embodiment of the present invention.

Firstly, referring to FIGS. 3, 4, and 5, FIG. 3 is an exploded stereogram of a clean container having an elastic positioning structure according to an embodiment of the present invention; FIG. 4 is a schematic partially enlarged diagram of Part A in FIG. 3; and FIG. 5 is a schematic combination stereogram of the clean container having an elastic positioning structure according to an embodiment of the present invention. The clean container 20 includes a base 30 and a cover 40 (the direction marked by a triangle indicates the front end). The base 30 has an upper surface 31 for supporting a plate of brittle material 70, at least one support element 32 disposed on the upper surface 31 for supporting the plate of brittle material 70, at least one lateral positioning element 33, and at least one back positioning element 34. The cover 40 is used for covering the base 30 firmly. The cover 40 has an accommodation space, and includes a top plate 41 on the top. The top plate 41 has an upper surface 42 and a lower surface 43, and the lower surface 43 has a positioning part 50 disposed thereon. A front end 51 of the positioning part 50 corresponding to the back positioning element 34 has a first elastic arm 52 and a second elastic arm 53 extended laterally, and the end surfaces of the first elastic arm 52 and the second elastic arm 53 are respectively facing downwards and backwards to form pushing surfaces 521, 531. Certainly, the pushing surfaces 521, 531 are mainly used to elastically and flexibly push the plate of brittle material 70 to move horizontally, thus being an inclined plane or a curved surface. Additionally, positioning surfaces 522, 532 are formed adjacent to the external side of the pushing surfaces 521, 531 of the first elastic arm 52 and the second elastic arm 53 respectively.

Moreover, a back end 511 of the back positioning element 34 corresponding to the positioning part 50 respectively has a third elastic arm 54 and a fourth elastic arm 55 extended laterally, and the third elastic arm 54 and the fourth elastic arm 55 respectively have flanges 541, 551 disposed on the bottom, and positioning slants 542, 552 disposed on the lower part of the external side of the end surface. The flanges 541, 551 can elastically press against the plate of brittle material 70 once the cover 40 is snapped with the base 30, so as to avoid the shaking when the clean container 20 is moved. The positioning slants 542, 552 can also guide and hold the plate of brittle material 70 in a correct position before the motion of the flanges 541, 551 (which will be described below in detail).

Furthermore, in order to enable the positioning part 50 to generate a more stable fixing force and provide a path for conducting the electrostatic charges after the cover 40 has been snapped with the base 30, the positioning part 50 can be further formed with a snapping arm 56 at the back end, which has a pair of grooves 561 with the opens facing downwards. The grooves 561 are corresponding to the back positioning element 34 at the back end of the base 30, for being snapped with the back positioning element 34 after the cover 40 has been snapped with the base 30 (as shown in FIG. 6C).

In the embodiment of the clean container 20, the base 30, the cover 40, and the positioning part 50 are made of a conductive material, and they are connected with each other, so as to facilitate conducting the electrostatic charges of the plate of brittle material 70 accommodated in the clean container 20 to the external side, and thus preventing the plate of brittle material 70 from being damaged by the electrostatic discharging.

Additionally, a snapping element 90 also can be disposed on the base 30 and the cover 40 of the clean container 20, so that after the cover 40 covers on the base 30, the two can be engaged automatically, and together with the positioning part 50 for pushing and pressing against the plate of brittle material 70, a self-locking system is formed.

Figure 6A:
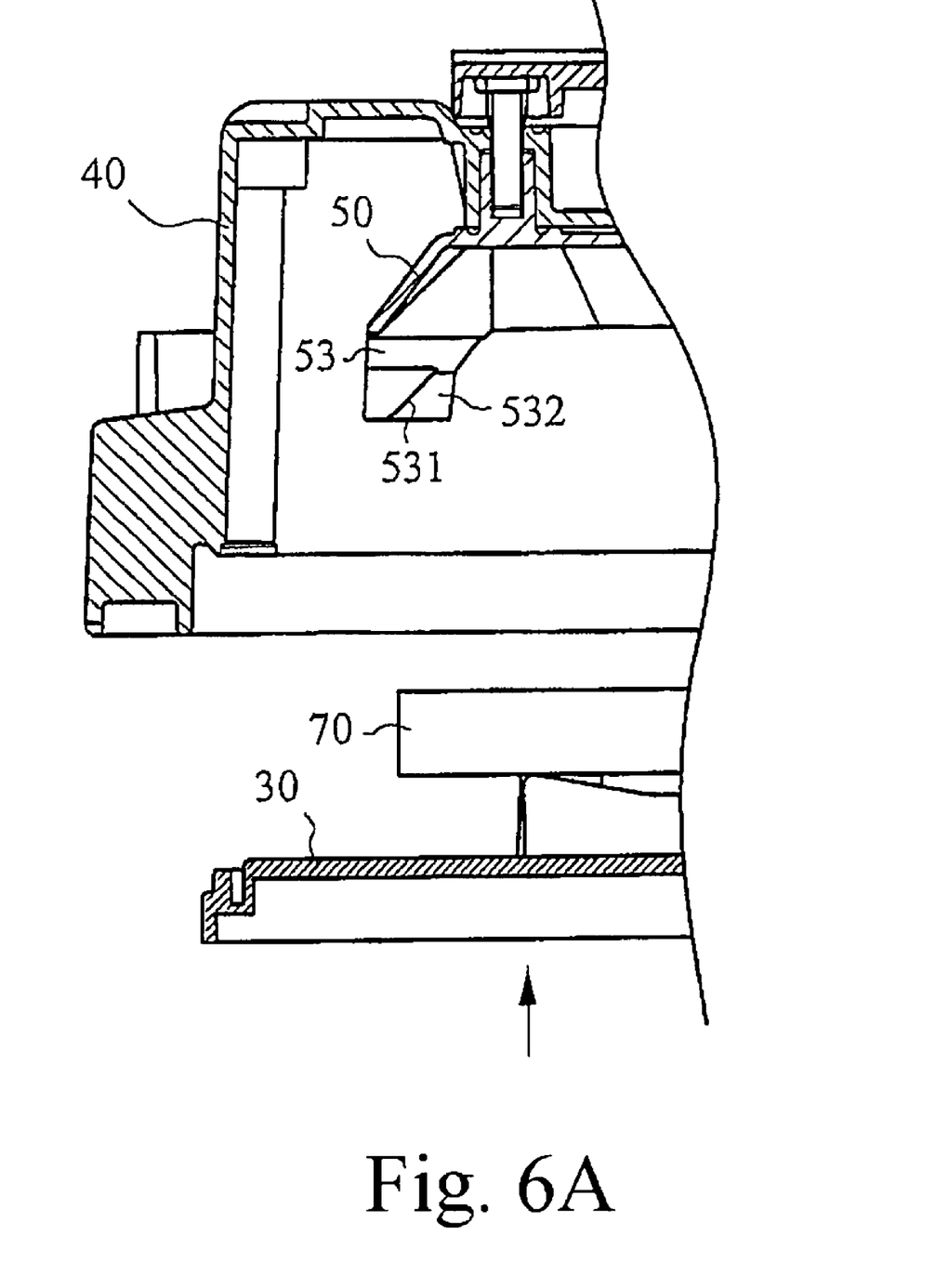
FIG. 6A is a sectional diagram of a clean container having an elastic positioning structure according to an embodiment of the present invention before the cover is closed i.e., FIG. 5, obtained along the line of B-B.
Figure 6B:
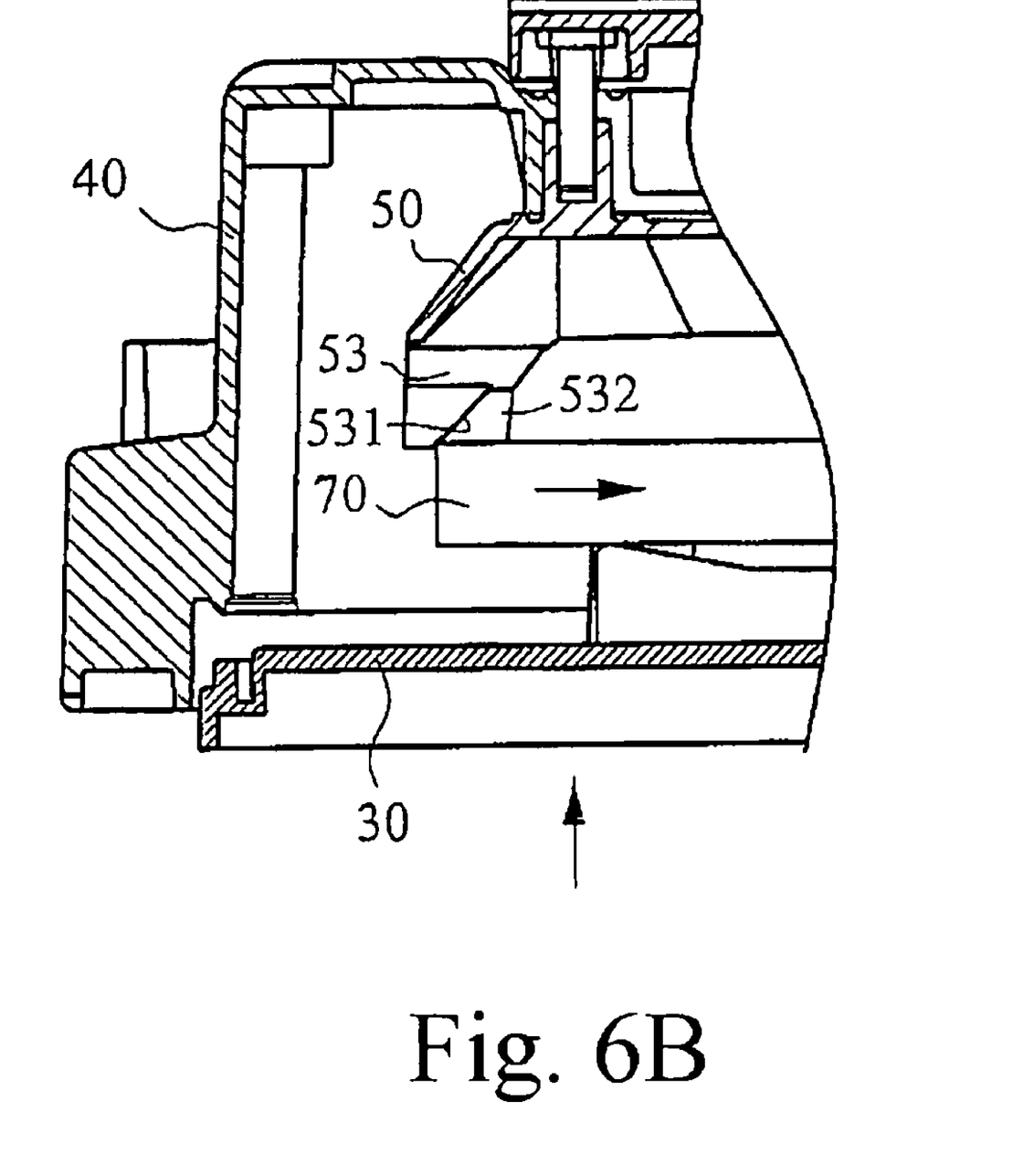
FIG. 6B is a sectional diagram of a clean container having an elastic positioning structure according to an embodiment of the present invention when the cover is closed, i.e., FIG. 5, obtained along the line of B-B.
Figure 6C:
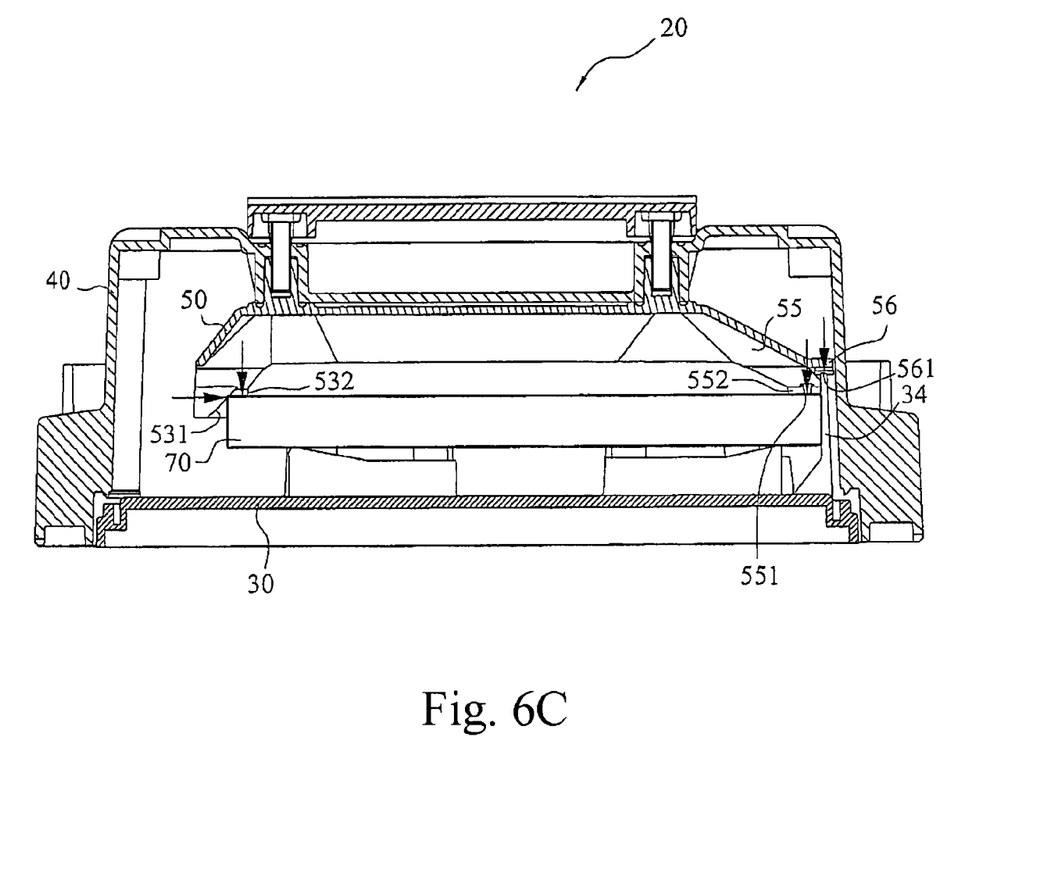
FIG. 6C is a sectional diagram of a clean container having an elastic positioning structure according to an embodiment of the present invention after the cover has been closed, i.e., FIG. 5, obtained along the line of B-B.

Next, referring to FIGS. 6A, 6B, and 6C, a sectional diagram of the closing procedure of a clean container having an elastic positioning structure according to an embodiment of the present invention is shown. As shown in FIG. 6A, after the cover 40 is fixed with an appropriate tool (driven manually or by a mechanical device, not shown), the plate of brittle material 70 that has substantially not been positioned is placed on the support element 32 of the base 30, and falls in the range between the lateral positioning element 33 and the back positioning element 34, and then, the base 30 is raised for being matched with the cover 40 (alternatively, the cover 40 is moved while the base 30 is fixed, both have the same effect). If the cover 40 has the snapping element 90 engaged thereon, the snapping element 90 should be moved into a releasing position at the same time, so as to facilitate the base 30 to pass through and thus being matched with the cover 40. As shown in FIG. 6B, when the plate of brittle material 70 is raised to an extent that the upper edge contacts the pushing surface 521 of the positioning part 50, due to the motion of the inclined plane or curved surface of the pushing surface 521, the plate of brittle material 70 is horizontally moved backwards, till the front edge presses against the back positioning element 34, as shown in FIG. 6C.

Figure 7:
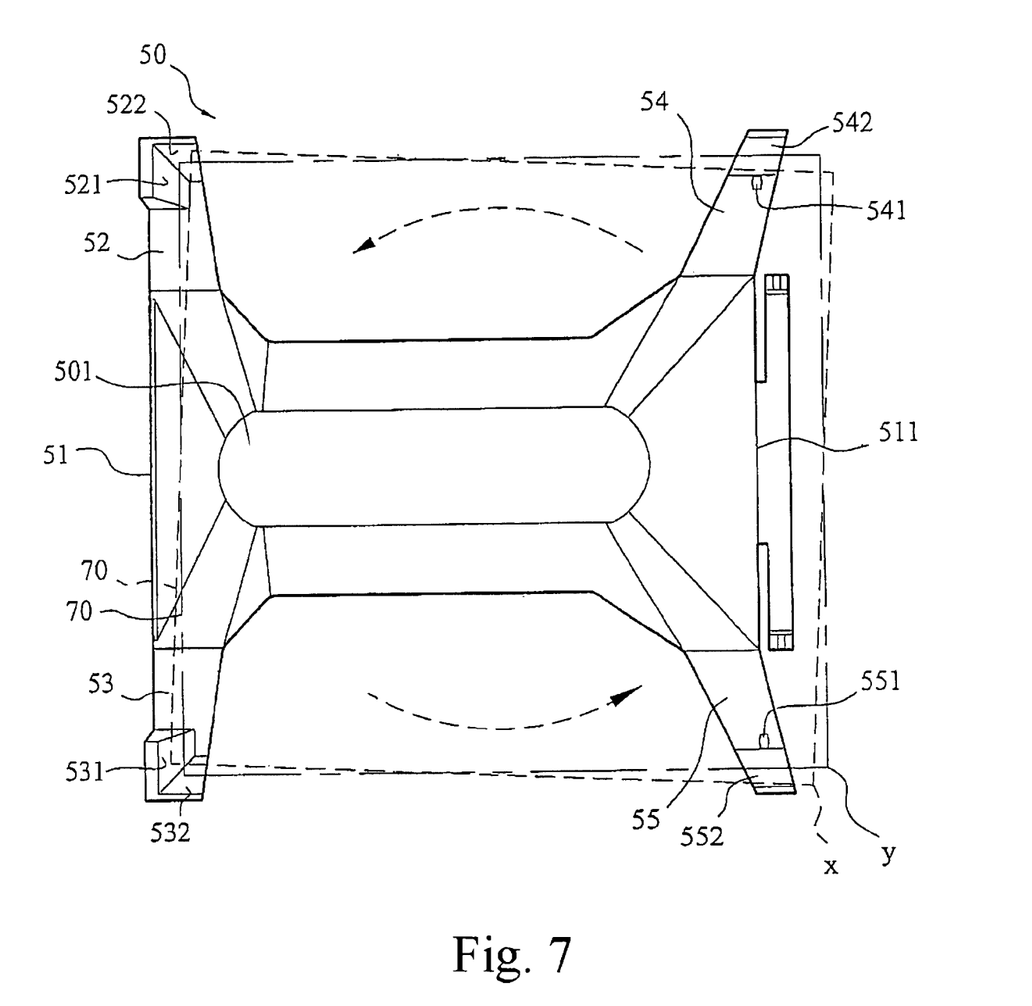
FIG. 7 is a schematic top view of motions of a positioning surface and an positioning slant for a positioning part of the clean container having an elastic positioning structure according to the present invention.

Next, referring to FIG. 7, it is a schematic top view of the motion of a positioning surface and a positioning slant for a positioning part of the clean container having an elastic positioning structure according to the present invention. Once the pushing surface 521 of the positioning part 50 pushes the plate of brittle material 70 horizontally backwards, the plate of brittle material 70 keeps a raising state simultaneously, and if the plate of brittle material 70 was deflected with a deflection angle (x, as shown in FIG. 7) when it was initially placed, besides the pushing surface 521 that can adjust the angle to y (as shown in FIG. 7) during the pushing motion, the positioning surfaces 522, 532 on the first and the second elastic arms 52, 53, and the positioning slants 542, 552 on the third and the fourth elastic arms 54, 55 also can adjust the angle. When the plate of brittle material 70 is raised up to the highest position, the first to the fourth elastic arms 52, 53, 54, and 55 can complete the process of pushing and positioning the angle and position. Finally, an interface between the first elastic arm 52 and 521, 522, an interface between the second elastic arm 53 and 531, 532, and the flanges 541, 551 on the third and the fourth elastic arms 54, 55 elastically press against the plate of brittle material 70. After the cover 40 has been snapped with the base 30, the positioning part 50 can achieve a self-locking effect for the plate of brittle material 70, so as to prevent the plate of brittle material 70 from sliding when the clean container 20 is moved, and together with the structure that the back positioning element 34 at the back end is snapped with the snapping arm 56, the fixing force of the positioning part 50 for holding the plate of brittle material 70 is enhanced.

Figure 8:
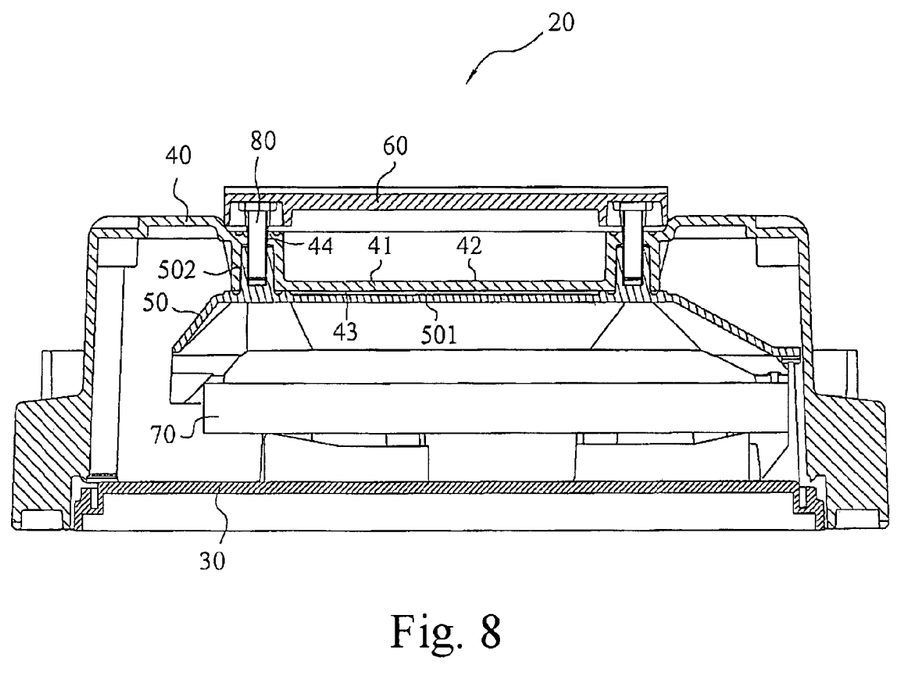
FIG. 8 is a sectional diagram of a screwed positioning part of a clean container having an elastic positioning structure according to an embodiment of the present invention.

Referring to FIG. 8, it is a sectional diagram of a screwed positioning part of a clean container having an elastic positioning structure according to an embodiment of the present invention. The cover 40 has at least one through-hole 44 pre-disposed on the top plate 41, which penetrates through the upper surface 42 and the lower surface 43. The positioning part 50 has at least one stud 502 corresponding to the through-hole 44 on the top surface of the body 501, and further has a mounting plate 60 screwed on the upper surface, such that by means of passing the bolt 80 through the through-hole 44 of the top plate 41 to be connected with the stud 502 of the positioning part 50, the mounting plate 60 and the positioning part 50 are fixed on the top plate 41 of the cover 40. Such a structure can be moved by a robot arm provided by the mounting plate 60 or moved manually, and the conductive bolt 80 connected to the positioning part 50 and the mounting plate 60 can be additionally used to conduct the electrostatic charges of the plate of brittle material 70 in the clean container 20 out of the clean container 20.

Figure 9:
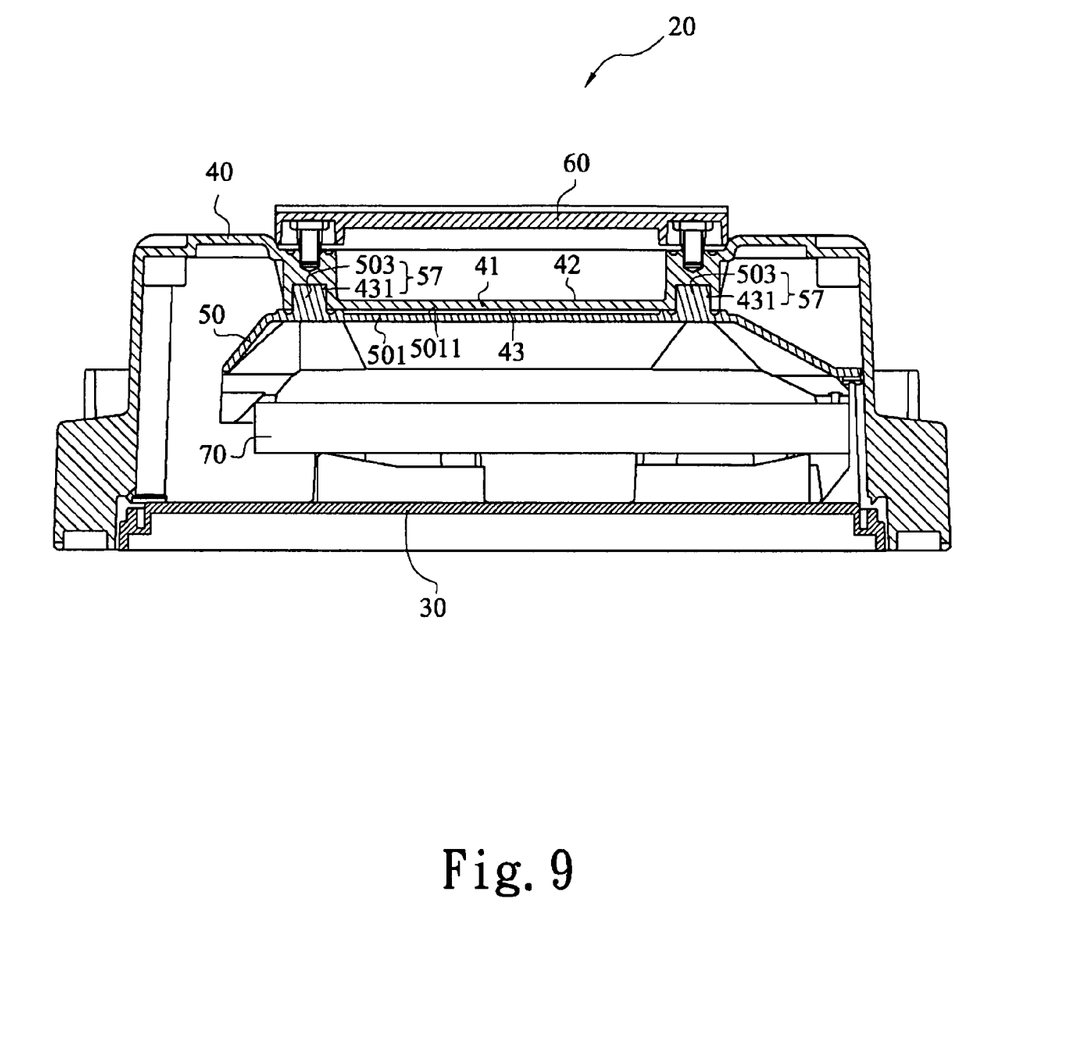
FIG. 9 is a sectional diagram of an engaging positioning part of a clean container having an elastic positioning structure according to an embodiment of the present invention.

Referring to FIG. 9, it is a sectional diagram of an engaging positioning part of a clean container having an elastic positioning structure according to an embodiment of the present invention. The positioning part 50 and the cover 40 can be assembled by utilizing an engaging structure 57. Particularly, the top plate 41 has a first engaging element 431 on the lower surface 43, the positioning part 50 has a second engaging element 503 corresponding to the first engaging element 431 on the top surface 5011 of the body 501, and thus, the first engaging element 431 and the second engaging element 503 form an engaging structure 57, so that the positioning part 50 is engaged on the lower surface 43 of the cover 40. Certainly, the first engaging element 431 can be at least one groove disposed on the lower surface 43 of the top plate 41, and the second engaging element 503 is an implementing aspect of a post corresponding to the groove, or alternatively, the first engaging element 431 is at least one post, and the second engaging element 503 is a groove corresponding to the post (not shown in this embodiment).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A clean container having an elastic positioning structure, comprising:
    a base, having an upper surface with at least one support element, at least one lateral positioning element, and at least one back positioning element being disposed thereon;
    a cover, for covering the base firmly, and having a top plate with an upper surface and a lower surface; and
    a positioning part, disposed on the lower surface of the cover, and having a body, and a front end corresponding to the at least one back positioning element, and a back end opposite to the front end, wherein
        the front end has a first elastic arm and a second elastic arm extended laterally, end surfaces of the first elastic arm and the second elastic arm respectively facing downward and backward to form a pushing surface;
        the back end has a third elastic arm and a fourth elastic arm extended laterally, the third and fourth elastic arms each having a flange formed on a bottom thereof; and
        the back end of the positioning part is further formed with at least one snapping arm having at least one downward groove corresponding to the at least one back positioning element of the base, such that the at least one groove is snapped with the at least one back positioning element after the cover is snapped with the base.

2. The clean container having an elastic positioning structure as claimed in claim 1, wherein the top plate further comprises at least one through-hole penetrating through the upper surface and the lower surface, the positioning part has at least one stud corresponding to the through-hole on a top surface of the body, and the top plate further has a mounting plate screwed on the upper surface, and the mounting plate is screwed to the stud on the positioning part by means of passing a bolt through the through-hole of the top plate.

3. The clean container having an elastic positioning structure as claimed in claim 1, wherein the pushing surface is an inclined plane or a curved surface.

4. The clean container having an elastic positioning structure as claimed in claim 1, wherein the end surfaces of the first elastic arm and the second elastic arm are respectively formed into a positioning surface, adjacent to an external side of the pushing surface.

5. The clean container having an elastic positioning structure as claimed in claim 1, wherein the third elastic arm and the fourth elastic arm respectively comprise a positioning slant on an external side of an end surface thereon.

6. The clean container having an elastic positioning structure as claimed in claim 1, wherein the base and the cover further comprise at least one snapping element, so as to snap the cover with the base firmly.

7. The clean container having an elastic positioning structure as claimed in claim 1, wherein the base, the cover, and the positioning part are made of a conductive material.

8. A cleaning container having an elastic positioning structure, comprising:
   a base, having an upper surface with at least one support element, at least one lateral positioning element, and at least one back positioning element being disposed thereon;
   a cover, for covering the base firmly, and having a top plate, wherein the top plate comprises an upper surface and a lower surface, and the lower surface of the top plate has a first engaging element; and
   a positioning part, disposed on a lower surface of the cover, and having a body, a front end corresponding to the at least one back positioning element, and a back end opposite to the front end, wherein
      the front end includes a first elastic arm and a second elastic arm extended laterally, end surfaces of the first elastic arm and the second elastic arm respectively facing downward and backward to form a pushing surface;
      the back end has a third elastic arm and a fourth elastic arm extended laterally, the third and fourth elastic arms each having a flange formed on a bottom thereof;
      a top surface of the body includes a second engaging element corresponding to the first engaging element, the first engaging element and the second engaging element forming an engaging structure, so as to embed the positioning part to the lower surface of the cover; and
      the back end of the positioning part is further formed with at least one snapping arm having at least one downward groove corresponding to the at least one back positioning element of the base, such that the at least one groove is snapped with the at least one back positioning element after the cover is snapped with the base.

9. The clean container having an elastic positioning structure as claimed in claim 8, wherein the first engaging element is at least one groove, and the second engaging element is a post corresponding to the groove.

10. The clean container having an elastic positioning structure as claimed in claim 8, wherein the first engaging element is at least one post, and the second engaging element is a groove corresponding to the post.

11. The clean container having an elastic positioning structure as claimed in claim 8, wherein an upper surface of the top plate further has a mounting plate screwed thereon, and the mounting plate is fixed on the cover through screwing a bolt to a corresponding nut hole in an upper surface of the cover.

12. The clean container having an elastic positioning structure as claimed in claim 8, wherein the pushing surfaces on the first elastic arm and the second elastic arm are an inclined plane or a curved surface.

13. The clean container having an elastic positioning structure as claimed in claim 8, wherein the end surfaces of the first elastic arm and the second elastic arm respectively form a positioning surface, adjacent to an external side of the pushing surface.

14. The clean container having an elastic positioning structure as claimed in claim 8, wherein the third elastic arm and the fourth elastic arm respectively comprise an positioning slant on an external side of an end surface thereof.

15. The clean container having an elastic positioning structure as claimed in claim 8, wherein the base and the cover further comprise at least one snapping element, so as to snap the cover with the base firmly.

16. The clean container having an elastic positioning structure as claimed in claim 8, wherein the base, the cover, and the positioning part are made of a conductive material.

17. A clean container having an elastic positioning structure, comprising:
   a base, having an upper surface with at least one support element, at least one lateral positioning element, and at least one back positioning element being disposed thereon;
   a cover, for covering the base firmly, and having a top plate with an upper surface and a lower surface; and
   a positioning part, disposed on the lower surface of the cover, and having a body, and a front end corresponding to the at least one back positioning element,
   wherein the front end has a first elastic arm and a second elastic arm extended laterally, end surfaces of the first elastic arm and the second elastic arm respectively facing downward and backward to form a pushing surface, and
   wherein the top plate further comprises at least one through-hole penetrating through the upper surface and the lower surface, the positioning part has at least one stud corresponding to the through-hole on a top surface of the body, and the top plate further has a mounting plate screwed on the upper surface, and the mounting plate is screwed to the stud on the positioning part by means of passing a bolt through the through-hole of the top plate.

18. The clean container having an elastic positioning structure as claimed in claim 17, wherein the pushing surface is an inclined plane or a curved surface.

19. The clean container having an elastic positioning structure as claimed in claim 17, wherein the end surfaces of the first elastic arm and the second elastic arm are respectively formed into a positioning surface, adjacent to an external side of the pushing surface.

20. The clean container having an elastic positioning structure as claimed in claim 17, wherein the third elastic arm and the fourth elastic arm respectively comprise a positioning slant on an external side of an end surface thereon.

* * * * *